(12) United States Patent
Goh et al.

(10) Patent No.: US 6,570,378 B2
(45) Date of Patent: May 27, 2003

(54) AMPLITUDE DECAY OF MAGNETIC STORAGE MEDIUM

(76) Inventors: NanLing Goh, Blk 439 Choa Chu Kang Ave 4, #07-451, Singapore (SG), 680439; UttHeng Kan, 85, Cashew Road, Cashew Height #03-04, Singapore (SG), 679656; Edmun ChiangSong Seng, 59, Faber Green, Singapore (SG), 129292; Victor WengKhin Chew, 36, #07-159, Chai Chee Ave, Singapore (SG), 471036

( * ) Notice: Subject to any disclaimer, the term of this patent is extended or adjusted under 35 U.S.C. 154(b) by 0 days.

(21) Appl. No.: 09/896,643

(22) Filed: Jun. 29, 2001

(65) Prior Publication Data

US 2002/0099979 A1 Jul. 25, 2002

Related U.S. Application Data

(60) Provisional application No. 60/218,025, filed on Jul. 12, 2000.

(51) Int. Cl.$^7$ ............ G06F 11/00; G01R 33/12; H04L 1/22
(52) U.S. Cl. ............ 324/212; 324/210; 714/42
(58) Field of Search ............ 324/210, 211, 324/212; 702/69; 714/42

(56) References Cited

U.S. PATENT DOCUMENTS

| | | | | |
|---|---|---|---|---|
| 4,847,558 A | * | 7/1989 | Fisher et al. | ............ 324/212 |
| 5,901,001 A | * | 5/1999 | Meyer et al. | ............ 360/25 |
| 5,905,695 A | * | 5/1999 | Kimura | ............ 369/13.24 |
| 6,147,488 A | | 11/2000 | Bamba et al. | |
| 6,260,257 B1 | * | 6/2001 | Emo et al. | ............ 29/603.09 |
| 6,281,677 B1 | * | 8/2001 | Cosci et al. | ............ 324/212 |

\* cited by examiner

*Primary Examiner*—Edward Lefkowitz
*Assistant Examiner*—Darrell Kinder
(74) *Attorney, Agent, or Firm*—Mitchell K. McCarthy

(57) ABSTRACT

A method of calculating an amplitude decay rate of a magnetic storage medium. The method involves (a) writing a test track to the magnetic storage medium and measuring the initial amplitude of the test track to obtain a reference amplitude; (b) performing a DC erase on the test track; (c) measuring and storing the test track amplitude after step (b) together with a time at which the measurement was made; (d) writing a reference track; (e) measuring and storing the reference track amplitude after step (d); (f) repeating steps (b) to (e) until a DC erase amplitude decay rate has been established; and (g) calculating a normal amplitude decay rate for the magnetic storage medium from the DC erase amplitude decay rate.

7 Claims, 3 Drawing Sheets

AMPLITUDE DECAY OF MAGNETIC STORAGE MEDIUM

RELATED APPLICATION

The present application claims benefit of the U.S. provisional patent application Ser. No. 60/218,025, filed Jul. 12, 2000.

FIELD OF THE INVENTION

The present invention relates to a method of assessing the amplitude decay of a magnetic storage medium and in particular to a method of calculating an amplitude decay rate of a magnetic storage medium. The invention finds particular application in measuring the amplitude decay of a disc drive.

BACKGROUND OF THE INVENTION

Currently, the areal density of disc drives is increasing at a rate of more than 50% annually. As areal densities increase, the signal to noise ratio (SNR) of the medium needs to improve so that the bit error rate of disc drives can be maintained. In order to obtain a better signal to noise ratio for the storage medium, the grain size of the magnetic medium is reduced. Unfortunately, as the grain size becomes smaller, the grains become magnetically unstable due to a superparamagnetic effect. This superparamagnetic effect, which is time and temperature dependent, will eventually prevent the medium from being able to retain stored data accurately. As a consequence, there is amplitude loss in the read back signal which causes a degradation in bit error rate. Thus, it is important to measure the rate at which the amplitude of the disc drive will decay over time.

Currently, the decay rate of the drive is measured by repeatedly writing a test track to a magnetic storage medium and measuring how the amplitude of the test track decays over time. However, this process takes an inconveniently long time, typically in terms of days or weeks. Therefore, it would be advantageous to provide a faster method of assessing the amplitude decay rate.

SUMMARY OF THE INVENTION

Accordingly, embodiments of the invention provide a method of obtaining an amplitude decay rate of a magnetic storage medium including steps of:

(a) writing a test track to the magnetic storage medium and measuring the initial amplitude of the test track to obtain a reference amplitude;

(b) performing a direct current (DC) erase on the test track using a small write current;

(c) measuring and storing the test track amplitude after step (b) together with a time at which the measurement was made;

(d) writing a reference track;

(e) measuring and storing the reference track amplitude after step (d);

(f) repeating steps (b) to (e) until a DC erase amplitude decay rate has been established; and (g) calculating a normal amplitude decay rate for the magnetic storage medium from the DC erase amplitude decay rate.

Embodiments of the invention also provide a method of accelerating the amplitude decay of a test track of a magnetic storage medium involving:

(a) writing a test track;

(b) performing a DC erase on the test track; and (c) repeating step (b) to accelerate the amplitude decay of the test track.

These and various other features as well as advantages which characterize embodiments of the present invention will be apparent upon reading of the following detailed description and review of the associated drawings.

BRIEF DESCRIPTION OF THE DRAWINGS

A preferred embodiment will now be described with reference to the accompanying drawings in which.

DETAILED DESCRIPTION

The present invention generally involves the use of a direct current (DC) erase on a track to obtain an "accelerated" decay rate for the track which is used to predict the normal amplitude decay rate for the track and hence, the amplitude decay rate of the disc drive.

A preferred embodiment of the present invention writes a first track once, and uses the lowest possible write current to perform a DC erase on the first track before each measurement of the amplitude of the first track. Using the method of the preferred embodiment, a decay rate trend can be observed within a shorter time than the traditional technique of reading the track over extended periods of time to determine the rate at which the magnetic medium is decaying. Measurement is also taken of the amplitude of a second track. The second track is rewritten just before each measurement of its amplitude. Measurements from the first track are normalized using measurements taken from the second track. Then, based on normalized results, the amplitude decay rate obtained using DC erase (DC erase decay rate) is correlated to a normal amplitude decay rate. The normal amplitude decay rate can be obtained using a conventional method, such as one that involves repeatedly reading a track after extended periods of time have lapsed. To predict the normal amplitude decay rate for other drives of similar configuration, much time can be saved by obtaining the DC erase decay rate and then applying the formula obtained from the correlation. Preferably, a factor and a fixed offset are found which relate the DC erase decay rate to the normal amplitude decay rate.

Figure 1:
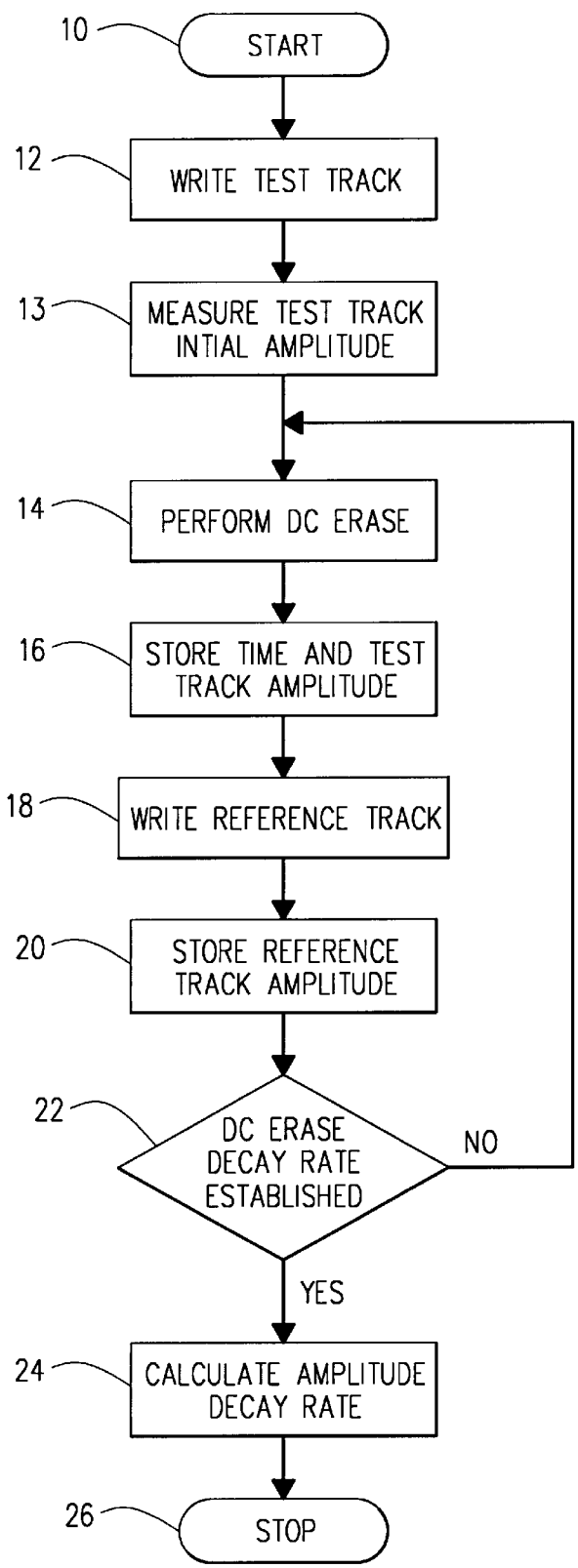
FIG. 1 is a flow diagram illustrating a method of obtaining an amplitude decay rate, according to a preferred embodiment.

More specifically, and with reference to FIG. 1, the process starts at step 10 and then at step 12 a test track is prepared by writing a 2T pattern with a normal drive level write current. This is measured to provide a reference measure against which the amplitude decay can be measured. The normal drive level of a write current will depend upon the write levels of the disc drive and in particular the pre-amplifier which is used on the disc drive.

At step 14 a DC erase is performed using a current substantially smaller than the normal drive level write current. In the preferred embodiment, this is performed with the minimum write current allowed by the pre-amplifier of the disc drive. Experimental results have determined that the lower the write current used, the greater the accuracy of results obtained.

Following the DC erase, at step 16 the time is stored and the test track amplitude is measured and stored.

A reference track is written at step 18 with a 2T pattern using a drive level write current. Then at step 20 the amplitude of the reference track is measured and stored.

At step 22 a determination is made as to whether the DC erase decay rate trend is sufficiently established to enable calculation of the amplitude decay rate. If it is not sufficiently established, steps 14 to 22 are repeated until the DC erase amplitude decay rate (DR) is established. When the DC erase amplitude decay rate is established the amplitude decay rate is calculated at step 24 and the process stops at step 26.

In order to calculate the amplitude decay rate, the following equations are employed.

$$DR_{nom} = DR\_DC_{min} \times F - O$$

Where $DR_{nom}$=normal amplitude decay rate $DR\_DC_{min}$=Decay rate with minimum write current (Imin) (i.e. DC erase amplitude).

$$Factor(F) = \frac{10 \wedge (OVW(I_{min})/10)}{10 \wedge (OVW(I_{nom})/20)}$$

Offset(O)=0.12

$OVW(I_{min})$ = Residual of 2T pattern written by nominal write current after DC erase with minimum write current ($I_{min}$)

$$= 20 * \log \frac{V_{DCerase}(I_{min})}{Init\_amplitude}$$

$OVW(I_{nom})$ = Residual of 2T pattern written by nominal write current 1w after DC erase with nominal write current $$= 20 * \log \frac{V_{DCerase}(I_{nom})}{Init\_amplitude}$$

Where Init_amplitude=amplitude of initial reference test track

To simplifying factor (F)

$$\text{From } OVW(I_{min}) \frac{OVW(I_{min})}{10} = \log\left(\frac{V_{DCerase}(I_{min})}{Init\_amplitude}\right)^2 \quad (1)$$

$$\Rightarrow 10 \wedge (OVW(I_{min})/10) = \log\left(\frac{V_{DCerase}(I_{min})}{Init\_amplitude}\right)^2$$

$$\text{From } OVW(I_{nom}) \frac{OVW(I_{nom})}{20} = \log\left(\frac{V_{DCerase}(I_{nom})}{Init\_amplitude}\right) \quad (2)$$

$$\Rightarrow 10 \wedge (OVW(I_{nom})/20) = \left(\frac{V_{DCerase}(I_{nom})}{Init\_amplitude}\right)$$

Substitute (1) and (2) into Factor formula $$Factor(F) = \frac{V_{DCerase}(I_{nom})^2}{Init\_amplitude^2} \times \frac{Init\_amplitude}{V_{DCerase}(I_{nom})}$$

$$= \frac{V_{DCerase}(I_{min})^2}{V_{DCerase}(I_{nom}) Init\_amplitude}$$

With reference to the above formulas, it will be appreciated that the offset value is derived from experimental results for the particular read/write head and media combination used in the disc drive.

Values of "$I_{min}$ overwrite" ($OVW(I_{min})$) were obtained using the following steps:
1. Write 2T pattern with drive level write current.
2. Measure fundamental of 2T amplitude (Init_amplitude).
3. Change write current to minimum value (via preamplifier register) and perform DC erase.
4. Measure fundamental of residual 2T amplitude ($V_{DC\ erase}(I_{nom})$).
5. Calculate "$I_{min}$ overwrite" as described above.

Values of "$I_{nom}$ overwrite" ($OVW(I_{nom})$) were obtained using the following steps:
1. Write 2T pattern with drive level write current.
2. Measure fundamental of 2T amplitude (Init_amplitude).
3. Perform DC erase with drive level write current.
4. Measure fundamental of residual 2T amplitude ($V_{DC\ erase}(I_{nom})$).
5. Calculate "$I_{nom}$ overwrite" based on formula stated above.

Enough values of $I_{min}$ overwrite and $I_{min}$ overwrite were obtained in order to have a significant sample of data so that the values reflected the characteristic of the properties of the disc drive.

Figure 3:
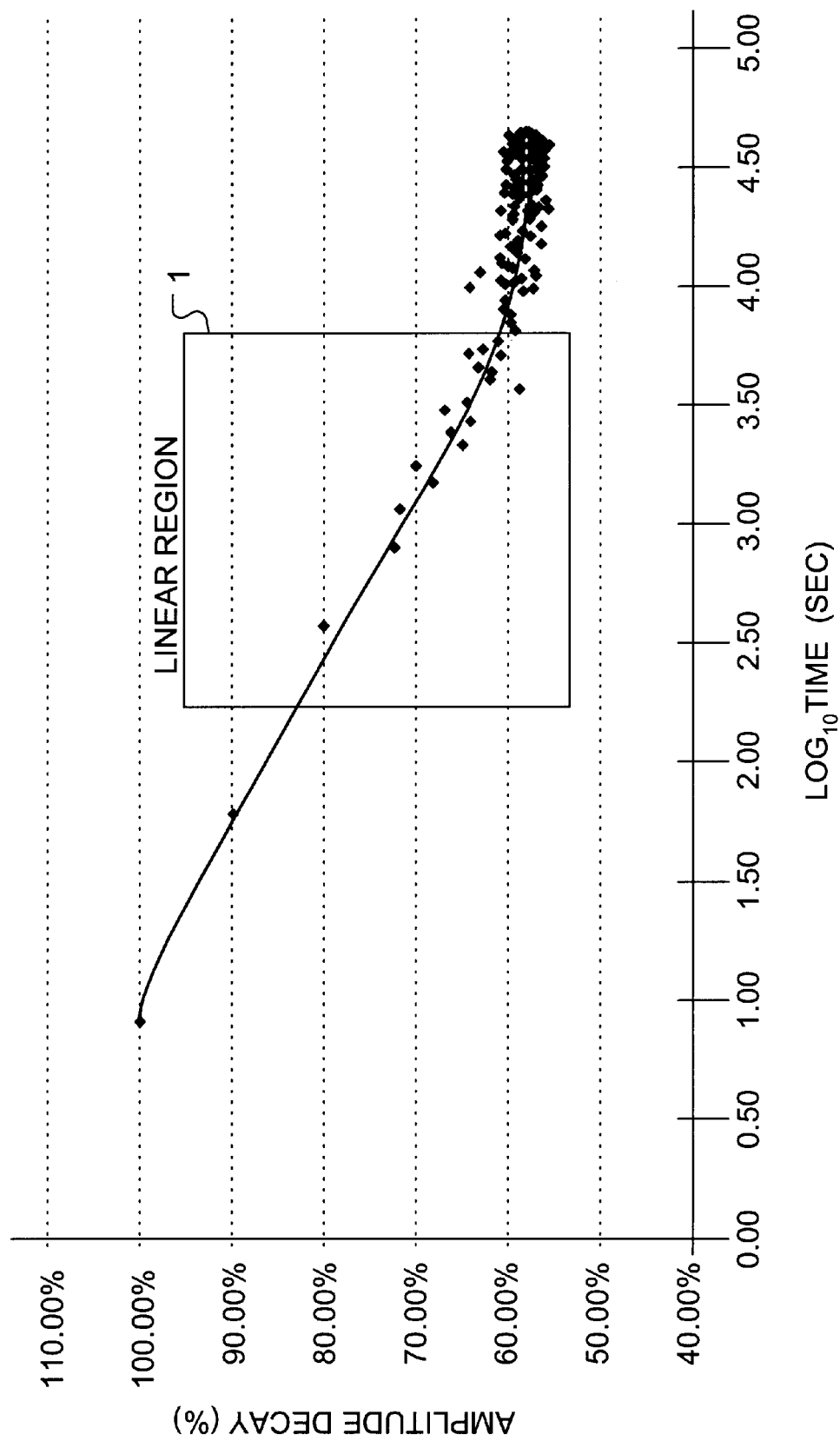
FIG. 3 is a graph of DC erase amplitude decay.

Then, from the results obtained using the method of the preferred embodiment, amplitude decays as percentage of the initial amplitude were plotted relative to the expired time in seconds using a logarithmic scale. These results are shown in FIG. 3. From the linear region 1 of the graph of FIG. 3, a value of the DC erase amplitude decay in percentage of amplitude reduction per time decade was obtained. This value can then be placed in the formula described above in order to obtain the normal amplitude decay rate in a much faster period than would traditionally be possible. It will be apparent from the graph of FIG. 3 that DC erase amplitude decay data can be obtained at around 3 hours which compares very favourably to the traditional method of amplitude decay which doesn't use a DC erase and which takes 16 hours or longer.

Once the amplitude decay rate is known the total amount of amplitude reduction in percentage over a 5-year period can be predicted. For example, 1% amplitude reduction per time decade will be equivalent to 8% in total amplitude reduction over an 5-year period.

Table 1 shows the efficacy of amplitude decay prediction using the above method.

TABLE 1

| Drive | Amplitude Decay Rate (%) | DCerase Decay Rate (%) | OVW $I_{wmin}$ (dB) | OVW $I_{wnom}$ (dB) | Predicted Decay Rate (%) | Absolute Error (%) |
|---|---|---|---|---|---|---|
| 1 | −0.911 | −23.560 | 2.98 | 40.13 | −0.581 | 0.330 |
| 2 | −0.650 | −37.398 | 1.21 | 40.12 | −0.607 | 0.043 |
| 3 | −0.384 | −15.708 | 1.23 | 40.39 | −0.319 | 0.065 |
| 4 | −0.824 | −24.491 | 3.84 | 40.56 | −0.676 | 0.148 |
| 5 | −0.305 | −32.976 | 0.47 | 43.58 | −0.363 | 0.058 |
| 6 | −0.613 | −31.524 | 2.15 | 40.77 | −0.593 | 0.020 |

Six drives were tested and the normal amplitude decay rate and the DC erase decay rate were both measured. The DC erase decay rate was used to predict a decay rate for the drive, and it will be apparent that in most cases the predicted decay rate was close to the amplitude decay rate. The test results show that the efficacy of predication is around +/−0.3% per decade which is an acceptable amount of error given the time saving using the technique of the preferred embodiment.

Figure 2:
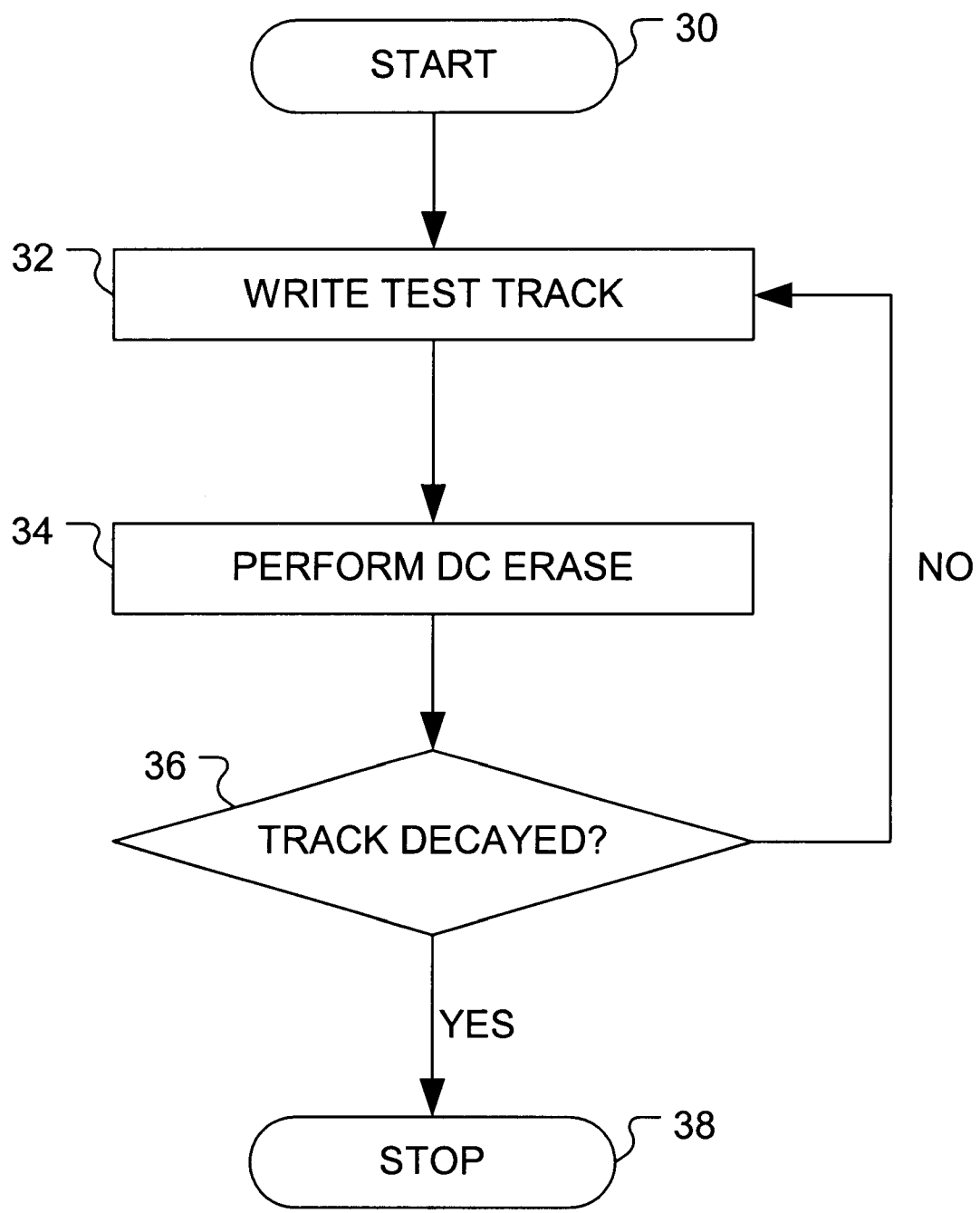
FIG. 2 is a flow diagram illustrating a method of accelerating the amplitude decay of a magnetic storage medium.

It will also be appreciated as illustrated in FIG. 2, embodiments of the present invention provide a method of accelerating a decay of a magnetic storage medium where a test track can be written and a DC erase performed at step 34 and the process repeated until the amplitude has decayed as indicated by step 36.

In the preferred embodiment, the method was carried out using a personal computer, a spectrum analyser (such as one available from Hewlett Packard) and Labview software (for example, that which is produced by National Instruments) in order to obtain the data.

Alternatively stated, a preferred embodiment of the present invention provides a method of obtaining an amplitude decay rate of a disc drive. The method involves steps of: (a) writing a test track; (b) measuring the initial amplitude of the test track to obtain a reference amplitude; (c) performing a direct current (DC) erase on the track; (d) measuring and storing the test track amplitude after step (b) together with a time at which the measurement was made; (e) writing a reference track; (f) measuring and storing a reference track amplitude after step (e); (g) repeating steps (c) to (f) until a DC erase amplitude decay rate has been established; and (f) calculating a normal amplitude decay rate for the magnetic storage medium from the DC erase amplitude decay rate. Most preferably, a lowest possible current is used to perform the DC erasing step.

Optionally, calculating an amplitude decay rate in step (g) may involve multiplying the DC erase amplitude by a factor (F) calculated from a residual amplitude of a test track written by a nominal write current ($I_{nom}$) after a DC erase with a minimum write current ($I_{min}$) and a residual amplitude of a test track written by a nominal write current ($I_{nom}$) after a DC erase with a nominal write current ($I_{nom}$). Optionally, calculating an amplitude decay rate in step (g) further involves applying an offset (O) from the multiplied DC erase amplitude, the offset being related to a head/media combination of the disc drive. The amplitude decay rate may be calculated using the formula:

$$\text{amplitude decay rate} = (DC_{erase} \text{amplitude decay rate}) \cdot F - O$$

where $$F = \frac{(V_{DCerase}(I_{min}))^2}{V_{DCerase}(I_{nom}) \times \text{Initial\_amplitude}}.$$

Preferably, the test track is written using a 2T pattern.

Another embodiment of the invention provides a method of accelerating the amplitude decay of a test track of a magnetic storage medium. The method involves steps of: (a) writing a test track using a first write current; (b) performing a DC erase on the test track using a second write current; and (c) repeating step (b) to cause the amplitude of the test track to decay. The magnetic storage medium may be a disc drive. The second write current is a minimum write current for the disc drive.

Expressed in another way, embodiments of the present invention may be described in terms of a method of predicting the amplitude decay rate of a magnetic storage medium in which the method includes carrying out a method described above to obtain an estimated amplitude decay rate for the magnetic storage medium, and extrapolating from the estimated amplitude decay rate to thereby predict the amplitude decay rate of the magnetic storage medium.

It will be apparent to persons skilled in the art that various modifications may be made to the invention without departing from the scope of the following claims.

What is claimed is:

1. A method of obtaining an amplitude decay rate of a disc drive comprising steps of:
   (a) writing a test track;
   (b) measuring the initial amplitude of the test track to obtain a reference amplitude;
   (c) performing a direct current (DC) erase on the test track;
   (d) measuring and storing the test track amplitude after step (c) together with a time at which the test track amplitude measurement was made;
   (e) writing a reference track;
   (f) measuring and storing a reference track amplitude after step (e);
   (g) repeating steps (c) to (f) until a normalized DC erase amplitude decay rate has been established; and
   (h) calculating a normal amplitude decay rate for the magnetic storage medium from the normalized DC erase amplitude decay rate.

2. A method as claimed in claim 1 in which the step (c) includes using a lowest possible current to perform the DC erase.

3. A method as claimed in claim 2, wherein calculating an amplitude decay rate in step (g) involves multiplying the DC erase amplitude by a factor (F) calculated from a residual amplitude of a test track written by a nominal write current ($I_{nom}$) after a DC erase with a minimum write current ($I_{min}$) and a residual amplitude of a test track written by a nominal write current ($I_{nom}$) after a DC erase with a nominal write current ($I_{nom}$).

4. A method as claimed in claim 3, wherein calculating an amplitude decay rate in step (g) further involves applying an offset (O) from the multiplied DC erase amplitude, the offset being related to a head/media combination of the disc drive.

5. A method as claimed in claim 4, wherein the amplitude decay rate is calculated using the formula:

$$\text{amplitude decay rate} = (DC_{erase} \text{amplitude decay rate}) \times F - O,$$

where $$F = \frac{(V_{DCerase}(I_{min}))^2}{V_{DCerase}(I_{nom}) \times \text{Initial\_amplitude}}.$$

6. A method as claimed in claim 1, wherein the test track is written using a 2T pattern.

7. A method of predicting the amplitude decay rate of a magnetic storage medium including carrying out the method of claim 1 to obtain an estimated amplitude decay rate for the magnetic storage medium and extrapolating from the estimated amplitude decay rate to thereby predict the amplitude decay rate of the magnetic storage medium.

* * * * *